United States Patent
Zhang et al.

(10) Patent No.: US 7,659,153 B2
(45) Date of Patent: Feb. 9, 2010

(54) SECTIONAL FIELD EFFECT DEVICES AND METHOD OF FABRICATION

(75) Inventors: Ying Zhang, Yorktown Heights, NY (US); Bruce B. Doris, Brewster, NY (US); Thomas Safron Kanarsky, Hopewell Junction, NY (US); Meikei Ieong, Wappingers Falls, NY (US); Jakub Tadeusz Kedzierski, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/142,849

(22) Filed: Jun. 20, 2008

(65) Prior Publication Data

US 2008/0254577 A1 Oct. 16, 2008

Related U.S. Application Data

(60) Continuation of application No. 11/433,806, filed on May 13, 2006, now Pat. No. 7,413,941, which is a division of application No. 10/732,322, filed on Dec. 10, 2003, now Pat. No. 7,388,258.

(51) Int. Cl.
*H01L 21/84* (2006.01)
(52) U.S. Cl. .............. 438/157; 438/164; 438/283; 257/E29.275; 257/E21.562
(58) Field of Classification Search ............ 438/149, 438/151, 156, 157, 164, 283; 257/327, 618, 257/E29.724, E29.725, E29.289
See application file for complete search history.

(56) References Cited

U.S. PATENT DOCUMENTS

| | | | |
|---|---|---|---|
| 4,907,053 A | 3/1990 | Ohmi | 257/315 |
| 5,136,350 A | 8/1992 | Itoh | 257/401 |
| 5,225,701 A | 7/1993 | Shimizu | 257/347 |
| 6,228,691 B1 | 5/2001 | Doyle | 438/149 |
| 6,475,890 B1 * | 11/2002 | Yu | 438/574 |
| 6,483,156 B1 | 11/2002 | Adkisson | 257/401 |
| 6,541,810 B2 | 4/2003 | Divakaruni | 257/302 |
| 6,562,665 B1 * | 5/2003 | Yu | 438/149 |
| 6,716,686 B1 | 4/2004 | Buynoski | 438/157 |
| 6,750,487 B2 | 6/2004 | Fried et al. | 257/270 |
| 6,800,910 B2 | 10/2004 | Lin | 257/410 |
| 2005/0001273 A1 * | 1/2005 | Bryant et al. | 257/369 |
| 2005/0023619 A1 | 2/2005 | Orlowski | 257/401 |

FOREIGN PATENT DOCUMENTS

| | | |
|---|---|---|
| JP | 04-268767 | 9/1992 |
| JP | 07-183528 | 7/1995 |

* cited by examiner

*Primary Examiner*—Ha Tran T Nguyen
*Assistant Examiner*—Daniel Whalen
(74) *Attorney, Agent, or Firm*—George Sai-Halasz (57) ABSTRACT

A field effect device is disclosed which has a body formed of a crystalline semiconductor material and has at least one vertically oriented section and at least one horizontally oriented section. The device is produced in SOI technology by fabricating first a formation of the device in masking insulators, and then transferring this formation through several etching steps into the SOI layer. The segmented field effect device combines FinFET, or fully depleted silicon-on-insulator FETs, type devices with fully depleted planar devices. This combination allows device width control with FinFET type devices. The segmented field effect device gives high current drive for a given layout area. The segmented field effect devices allow for the fabrication of high performance processors.

14 Claims, 6 Drawing Sheets

SECTIONAL FIELD EFFECT DEVICES AND METHOD OF FABRICATION

CROSS REFERENCE TO RELATED APPLICATIONS

This application is a continuation of application Ser. No. 11/433,806 filed May 13, 2006, which application in turn is a divisional of application Ser. No. 10/732,322, filed Dec. 10, 2003, now U.S. Pat. No. 7,388,258 issued Jun. 17, 2008. Both of these applications are incorporated herein by reference in their entirety.

FIELD OF THE INVENTION

The present invention relates to the field of integrated circuits and their manufacturing. More particularly, the present invention relates to field effect semiconductor devices with the device body having horizontally oriented and vertically oriented sections.

BACKGROUND OF THE INVENTION

Today's integrated circuits include a vast number of devices. Smaller devices are key to enhance performance and to improve reliability. As FET (Field-Effect-Transistor) devices are being scaled down, the technology becomes more complex. There is great difficulty in maintaining performance improvements in devices of deeply submicron generations. Several avenues are being explored for keeping device performance improvements on track Along the path of seeking ever higher device performances, downscaling of FET devices is the established guiding principle for current CMOS device technology. However, there are visible limits to straightforward downsizing as, among other issues, short-channel effects (SCE) become a major problem when devices are scaled down to the nanometer regime. A proposed way out of this problem is the use of double gated devices. Such a device is not simply a planar structure conducting on one surface, but conducting on two sides of the device body. The reasons that a double gate device can be downscaled further than a regular planar device are relatively complex, but they have been already given in the technical literature, for instance in: "Device Design Considerations for Double-Gate, Ground-Plane, and Single-Gated Ultra-Thin SOI MOSFET's at the 25 nm Channel Length Generation," by H.-S. P. Wong, et al, 1998 IEDM Tech Dig., pp. 407-10.

A variation of the double gated device is the so called FinFET device. In finFETs, the body of the transistor is formed in a vertical structure. The gate of the FinFET is engaging the vertically oriented body on both faces, or sides. FinFETs have several advantages, such as better SCE and are promising extensions of the mainline semiconductor technology. In general FinFET devices and manufacturing is tied in with semiconductor-on-insulator (SOI), usually meaning silicon-on-insulator technology. SOI devices, either customary planar ones, or vertically oriented ones, are fabricated in a thin semiconductor layer disposed over an insulator layer. Most commonly, the insulator layer is a so called buried oxide layer on a silicon (Si) substrate. There is a trend toward fabricating the planar FETs in ever thinner SOI layers, thereby increasing performance. State of the art planar SOI devices have so called fully depleted bodies, meaning lacking mobile charge carriers in the body, except for those induced by the gate electrode in the channel. FinFET devices typically have fully depleted bodies, as well, due to the narrowness of the vertically oriented structure. Also, the advantages of having gates on opposing sides of the vertically oriented body are more pronounced when the body is fully depleted between the two faces that are engaged by the gate electrode.

One of the disadvantages that FinFET devices have is that all the FinFET device widths are the same because the device width is determined by the height of the Fin. The uniformity of device widths places difficult constrains on circuit designs.

SUMMARY OF THE INVENTION

This invention teaches a structure and a method of fabrication for FinFET like devices with variable widths. The contemplated structures include a combination of FinFET like structures with an ultra-thin planar structure resulting in a multiple faced device. In general, this disclosure teaches a FET device on an insulating layer, when the device has a combination of vertically oriented and horizontally oriented sections, yielding an almost arbitrary capability of device width control coupled with FinFET like structures.

The invention teaches the method for fabricating such structures. One uses a combination of sidewalls and an insulator layer, which insulator layer is disposed over a SOI layer, to create a formation of walls standing on the patterned insulator layer. This formation is then transferred, with the aid of several etching steps, into the SOI layer. Where the wall was standing there will be Fins formed in the SOI, giving the vertically oriented sections of the body. Where the insulator layer covered the SOI, there will emerge the horizontally oriented section of the body. After fabricating the sectional body, further processing yields the sectional FET device on SOI, which combines the advantages of FinFET devices with those of ultra shallow planar SOI devices. This gives device width control with excellent layout density.

BRIEF DESCRIPTION OF THE DRAWINGS

These and other features of the present invention will become apparent from the accompanying detailed description and drawings, wherein.

DETAILED DESCRIPTION OF THE INVENTION

FIG. 1 shows schematic cross sectional views of the body regions of various embodiments of sectional FETs. In general, a Field-Effect-Transistor (FET) is a device where the current flow is controlled by a gate electrode between two parts of the device, the source and the drain. The gate electrode exerts its control with a field over the body of the device. The body is between the source and the drain and the gate electrode engages the body over a surface, or face. The gate electrode typically, but not necessarily, is separated form the face, or faces, of the body by a gate dielectric. The body of the FET is a crystalline semiconductor, where the face upon which the gate electrode exerts its field can form a conductive channel between the source and the drain. The common FET as known in the art has a single horizontal body section engaged by the gate electrode. The present disclosure contemplates FET devices with multiple body sections, having both horizontally oriented and vertically oriented sections. The orientations of the sections are with reference to a plane which contains the source and the drain. The sectional FETs of this disclosure are representatives of a so called semiconductor-on-insulator technology, where the device is disposed over an insulator. The dominant semiconductor of the microelectronic arts is silicon, and term silicon-on-insulator (SOI) is also commonly used to define devices disposed over insulators.

Figure 1A:
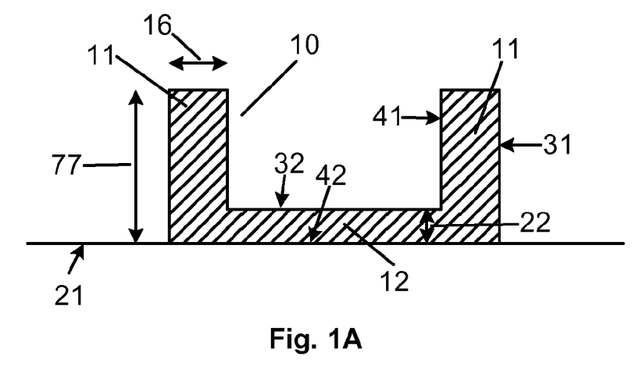
FIG. 1 shows schematic cross sectional views of the body regions of various embodiments of sectional FETs.

A representative embodiment of the body of a sectional FET is shown in cross section in FIG. 1A. The body 10 is a crystalline semiconductor material. In a representative embodiment the crystalline semiconductor material of the body 10 belongs in the broad category of Si based materials. In microelectronics technology the material that has progressed the farthest in miniaturization is silicon (Si). Si based materials are various alloys of Si in the same basic technological content as Si. One such Si based material of importance for microelectronics is the silicon-germanium. (SiGe) alloy. In a representative embodiment the crystalline semiconductor material of the body 10 is essentially Si. One skilled in the alt, however, would recognize that other semiconductors materials beyond Si and SiGe, such as III-V alloys, can also be contemplated. According to the teaching of this disclosure the sectional FET body has at least one vertically oriented section and at least one horizontally oriented section. In FIG. 1A the body in cross section 10 has two vertically oriented sections 11, and one horizontally oriented section 12. Vertically oriented sections 11 each comprise two opposing faces 31 and 41. The horizontally oriented section 12, as typically all horizontally oriented sections comprise a top face 32, and a bottom face 42. The bottom face 42 is interfacing with an insulating surface 21. The vertically oriented sections have a first height 77, and a first width 16. The horizontally oriented section 12 has a first thickness 22. In a representative embodiment the first height 77 is between about 30 nm and 150 nm. In a representative embodiment the first thickness 22 is between about 2 nm and 50 nm. This disclosure teaches narrow width for the at least one vertically oriented section 11 of the sectional FET, such that the first width 16 is less than the minimum linewidth of the technology in which the FET is manufactured in. At any given point in the state of the art of semiconductor processing there is a minimum feature size that the technology is capable of achieving by lithography. This linewidth is customarily given as the name of the technology of a given generation, for instance: "a 0.25 μm technology" etc. The first width 16 of the vertically oriented section is less than this minimum lithographic linewidth, independently in which particular technology generation the sectional FET is produced in, since the first width 16 is not produced by lithography.

Figure 1B:
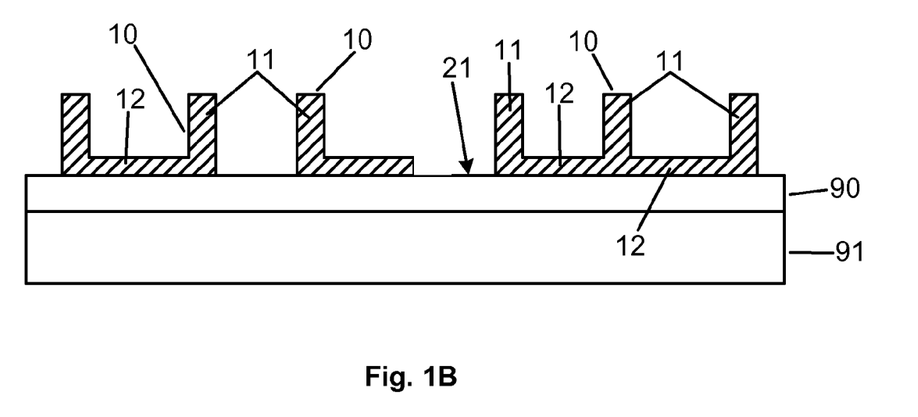

FIG. 1B shows exemplary embodiments of sectional FET bodies 10 with differing number of horizontally oriented 12 and vertically oriented 11 sections. The figure, which shows three differing bodies 10, is only for representative purposes and should not be interpreted restrictively. The teaching of the disclosure is capable to produce any number of horizontally oriented and vertically oriented sections. The insulating surface 21 typically is a top surface of an insulator layer 90, on which the crystalline semiconductor material of the sectional FET body is disposed. The insulator layer 90 is typically disposed over a substrate 91. In a representative embodiment the insulator layer 90 is $SiO_2$, and the substrate 91 is a Si wafer. Typically the sectional FET is produced in SOI technology, where a so called buried oxide ($SiO_2$) is disposed over a Si substrate, and an SOI silicon layer is disposed over the buried oxide. In a representative embodiment the sectional FET is fabricated in an SOI layer.

Figure 1C:
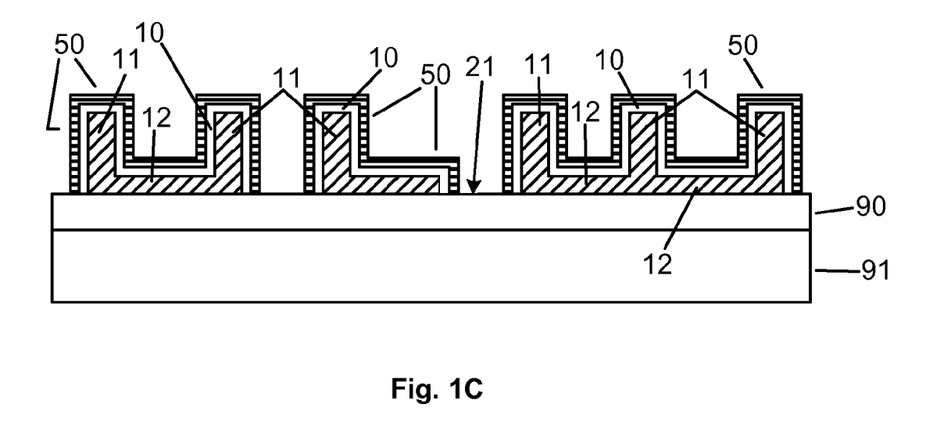

FIG. 1C shows exemplary embodiments of the sectional FET bodies 10 of FIG. 1B with a gate electrode 50 engaging the top face 32 (indicated in FIG. 1A) of the at least one horizontally oriented section 12 and the opposing faces 31 and 41 (indicated in FIG. 1A) of the at least one vertically oriented section 11. The sectional devices provide a combination of two types of high performance devices. The vertically oriented sections 11 are similar to the so called FinFETs, or vertical devices, while the horizontally oriented section 12 is similar to an ultra thin bodied planar device. If final devices should be built as fully depleted silicon-on-insulator (FD-SOI), FETs, the typical first width 16 of the vertically oriented sections 11, is about twice of the first thickness 22 of the horizontally oriented section 12. In this disclosure all the faces of all of the sections are engaged by single gate electrode 50, leading to low capacitance and high current driving capability for the sectional devices. The FET on the left of FIG. 1C shows one horizontally oriented section 12 situated between two vertically oriented sections 11, with the gate electrode engaging simultaneously four vertically oriented faces and one horizontally oriented face, for a total of five. Such a device can be called a pentagate FET.

In representative embodiments the body of the sectional FETs shown in FIG. 1 are fully depleted, which means the body does not have mobile charge carriers, except for those induced by the gate electrode in the channel. In SOI technologies for the usual planar devices whether a body is depleted or not depends of the doping level of the body and the thickness of the body. For the vertically oriented sections, again beside the doping level, the first width 16, the distance between the opposing faces engaged by the gate electrode, of the vertical section is the one that matters from the point of view of depletion. In the sectional FETs of the present disclosure one can make the first thickness of the horizontally oriented section 22 thin enough to be fully depleted. Since the vertical sections are not constrained by lithography limitations they too can be made sufficiently narrow, that they can become fully depleted. SOI devices. Fully depleted bodies have numerous advantages, as it is known by those ordinarily skilled in the art.

Figure 2A:
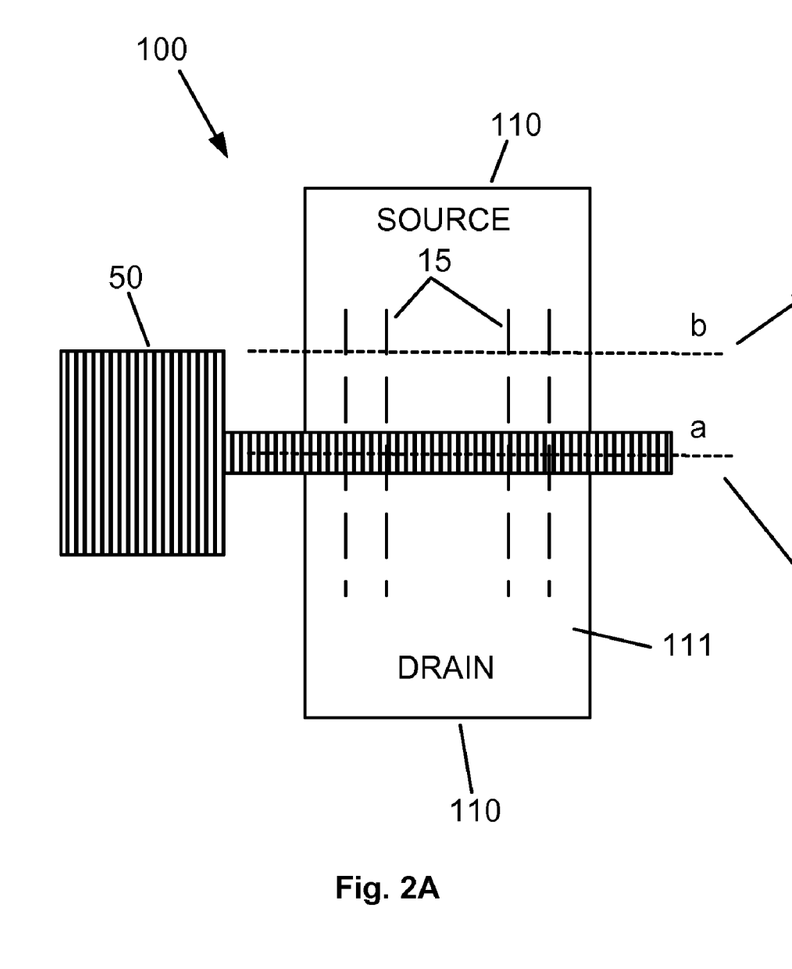
FIG. 2 shows a schematic top view and cross sectional views of a sectional FET.
Figure 2B:
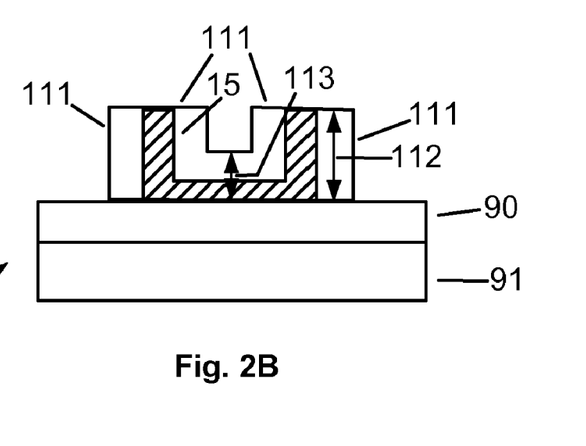
Figure 2C:
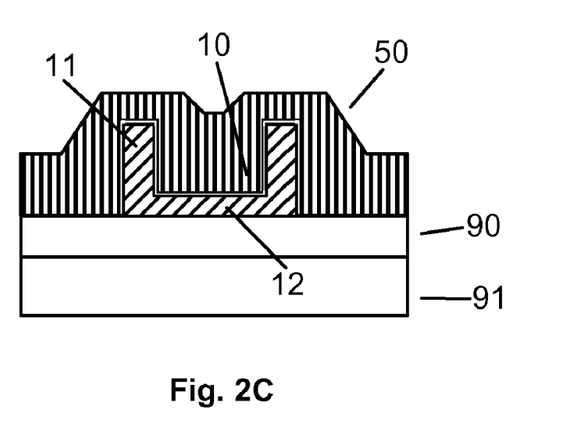

FIG. 2 shows a schematic top view and cross sectional views of a sectional FET. In FIG. 2A the sectional FET 100 comprise the source/drain 110, the gate 50, and the body 10 (visible only in FIG. 2C) under the gate electrode. During the fabrication of the sectional FET one produces a certain structure, which we call kernel 15. (The word kernel expresses the role this structure plays.) The kernel 15 comprises the body: as that portion of the kernel which is engaged by the gate electrode becomes the body 10. As produced, the kernel 15 has essentially the same cross sectional dimensions as the body. In portions other than the body, the kernel 15 becomes a component of the source/drain 110. For source/drain it is desirable to have as low resistance as possible, and to have enough bulk for easy wiring contacts, and/or silicidation. Such properties call for more material than was produced in the kernel, since the primary concern there was to comply with the requirements for the body. Therefore, in representative embodiments of the sectional FETs, for the purpose of turning portions of the kernel—those portions that do not form the body—into an improved source/drain 110, a third layer 111 is deposited over those kernel portions. In FIG. 2A the rough location of the kernel 15 is indicated only by broken lines, since in the source/drain regions the kernel 15 is typically underneath the third layer 111 and not visible in a top view. In a representative embodiment the kernel is a Si based material, typically Si, and the third layer 111 consists of the same material as the kernel 15. Accordingly, in a representative embodiment one selects the third layer 111 to consist of the same crystalline semiconductor material as the kernel 15, typically Si, and selects the depositing to be carried out by selective epitaxy over the kernel in the source/drain 110. This result can be seen in FIG. 2B which is a cross section of FIG. 2A along the dotted line "b". The kernel 15 in the source/drain 110 has the same cross sectional features as the body 10, but it is covered by third layer 111. In the case of an epitaxial deposition, the third layer 111 would be essentially indistinguishable from the kernel 15. Since in such embodiments the kernel 15 and the third layer 111 together make up the source/drain 110, the minimum thickness 113 of the source/drain is larger than the first thickness 22 of the body's horizontally oriented section. The maximum thickness 112 of the source/drain is at least as large as the first height 77 of the body's vertical section. The maximum thickness 112 of the source/drain may also be over the first height 77, as this is depending on the deposition technique and further processing. One skilled in the art would understand the tradeoffs involved in the question of increasing the maximum thickness 112 of the source/drain 110

FIG. 2C is a cross sectional view of the gate 50 and the body 10, (similar to FIG. 1C) along the dotted line "a" of FIG. 2A. The gate 50 is engaging the various faces of the at least one vertical section 11 and the at least one horizontally oriented section 12. As is clear from FIG. 2C, the body portion of the kernel is not covered by third layer 111.

FIGS. 3 to 7 show stages of a representative method of fabrication of a sectional FET. In general the present disclosure teaches that first a formation of walls and layers is fabricated on top of a SOI layer and then this formation is transferred down—with the help of various etchings—into the SOI layer, forming the kernel, which kernel is then the foundation for building up the sectional FET 100.

Figure 3:
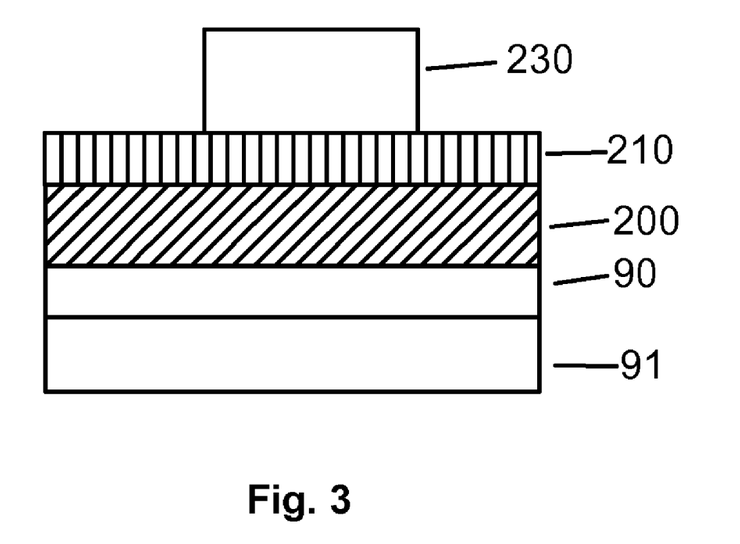
FIG. 3 shows schematically a state in the fabrication method where a fourth layer has been deposited and patterned.

FIG. 3 shows, in a schematic cross section, a stage in an exemplary embodiment of the method for fabricating a sectional FET, at a step along the method for creating the formation 310 (shown in FIG. 6). An insulator layer 90 is disposed over a substrate 91. In a representative embodiment the insulator layer 90 is a buried $SiO_2$, and the substrate 91 is a Si wafer. Disposed over the insulator 90 is a first layer 200 of a crystalline semiconductor material 200. This first layer 200 is the one into which the kernel 15 comprising the body of the sectional FET will be etched into. In a representative embodiment the first layer is Si with a thickness of between about 30 nm and 150 nm. Disposed on top of the first layer 200 is second layer 210, in an exemplary embodiment a $SiO_2$ layer. This $SiO_2$ layer 210 can be disposed over the first layer by any of the known methods in the art. Onto layer 210, a fourth layer is deposited and then patterned 230, (shown after the patterning). In a representative embodiment the fourth layer 230 is an amorphous Si layer, in the range of about 70 nm-120 nm thickness, typically deposited by low pressure chemical vapor deposition (LPCVD) or rapid thermal CVD (RTCVD).

Figure 4:
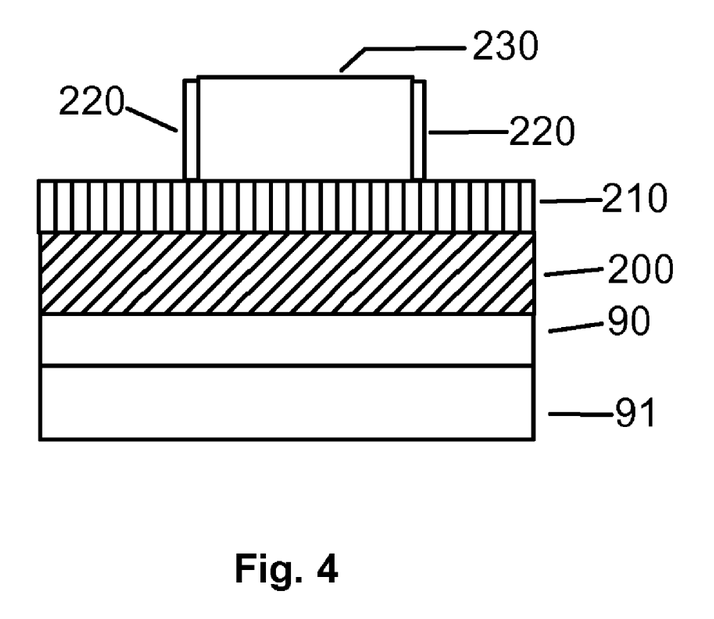
FIG. 4 shows schematically a state in the fabrication method where sidewalls have been formed around the pattern of the fourth layer.

FIG. 4 shows in a schematic cross section the fabrication at a stage when a sidewall creation process has been completed, involving the fourth layer 230. The sidewall 220 can be produced by standard spacer-etch techniques, well known in the electronic processing arts. In a representative embodiment this wall 220 is made of silicon-nitride ($Si_3N_4$). The width of the wall 220 is independent of lithographic capabilities of the processing technology, since no patterning step is involved in its fabrication.

Figure 5A:
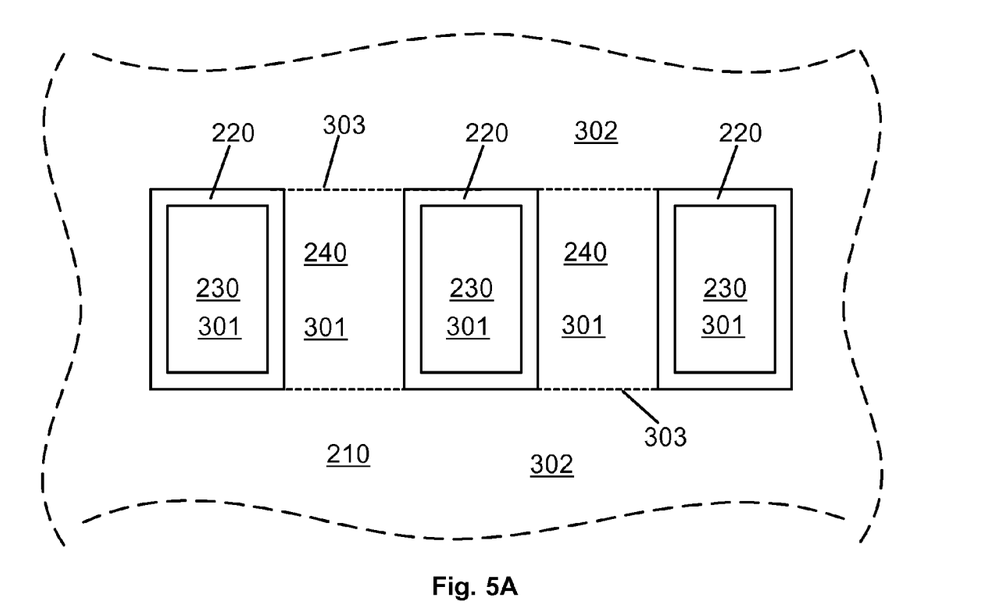
FIG. 5A shows schematically a top view of fabrication method, having an optional fifth layer deposited and having an inside and an outside defined.
Figure 5B:
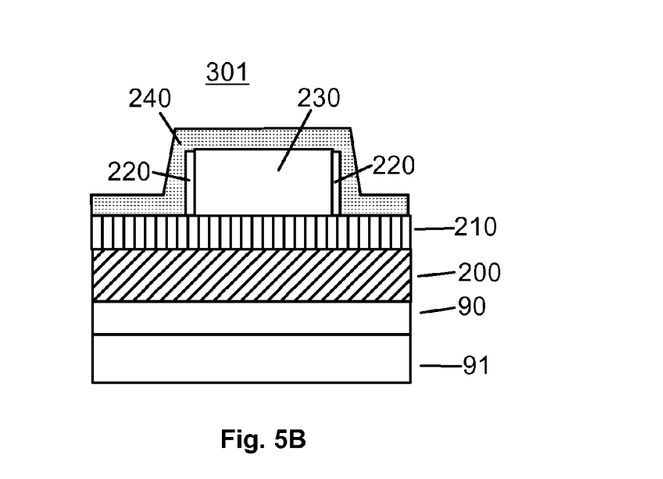
FIG. 5B shows a schematic cross sectional view of an inside portion, with an optional fifth layer deposited.

FIG. 5A shows schematically a top view of the method at the stage after the wall 220 fabrication. There exists at least one island of the fourth layer 230; in the figure for illustration purposes three islands are shown. These fourth layer islands 230 are surrounded by the wall 220. A large part of the visible surface is the second layer 210. FIG. 5 shows how the surface is divided into regions of inside the wall and of outside the wall. Even though there may be more than one island involved in the fabrication of a single kernel, one can talk of a single wall, with an inside 301 and an outside 302. If there is only one island 230, the inside 301 is self evident, being the island region 230. If the kernel to be fabricated needs more than one island—which is the case when one desires to have more than two vertical sections in the final sectional FET—at this stage one has to lithographically define the extent of the kernel, which region, as an example, in FIG. 5A is shown by dotted lines 303. In this case the inside of the wall 301 is defined as the area inside the dotted lines 303, and the outside of the wall 302 is defined as the area outside the dotted line 303. For the case of multiple islands in order to protect the second layer 210 in the whole of the inside 301, one deposits a fifth layer of material 240, as shown in FIG. 5B. This fifth layer 240 in an exemplary embodiment can be of the same material as the fourth layer 230, typically amorphous Si. With the protection of the fifth layer 240 in place one can etch the second layer 210 outside the wall, without effecting the second layer 210 inside the wall. If the kernel is in need of no more than two vertical sections, then one island 230 is sufficient, and there is no need to deposit the fifth layer 240, since then the fourth layer 230 which was used to create the wall 220 automatically protects layer 210 in the inside 301.

Figure 6A:
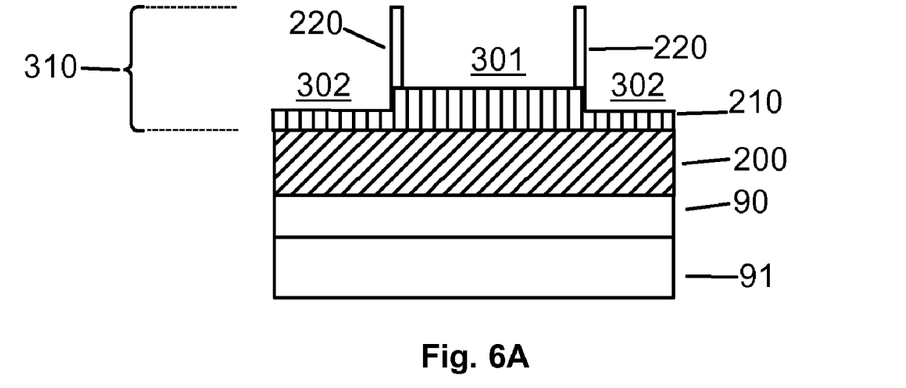
FIG. 6A shows a schematic cross sectional view of a state in the fabrication method where a masking formation has been reached.

FIG. 6A shows in a schematic cross section the method once the formation 310 has been completed. The formation has a wall 220, typically silicon-nitride ($Si_3N_4$), and a second layer 210, typically $SiO_2$, the second layer is disposed over the first layer 200, typically Si. The wall 220 is disposed on the second layer 210, and the wall has an inside 301 and an outside 302. The second layer 210 is thinner in the outside 302 than in the inside 301. In a representative embodiment, from the state depicted on FIG. 4 one can arrive at having fabricated the formation as shown in FIG. 6A, by executing the following steps. An etching step to partially remove the $SiO_2$ layer 210 over the outside 302. Such etching steps are well known in the art, either in a dry etch format, or by a wet etch. If there is only one island involved, one can combine this etching step of partially removing the oxide 210 from the outside with the earlier wall fabrication step of etching the wall material. Next, one etches, again with standard methods, to leave only the silicon-nitride wall 220 and the $SiO_2$ layer over the first material. This step involves the removal of the amorphous Si layer 230, and if present, the removal of the fifth layer 240. Removal of fifth layer 240 usually is not problematic since usually the fifth layer 240 is the same material as the fourth 230, namely, amorphous Si. When these two etching steps are done the formation 310 is ready. As is evidenced in FIG. 6A, and confirmed in FIGS. 6B to 6D the formation 310 represents a pattern that can be replicated in the first layer 200.

Figure 7:
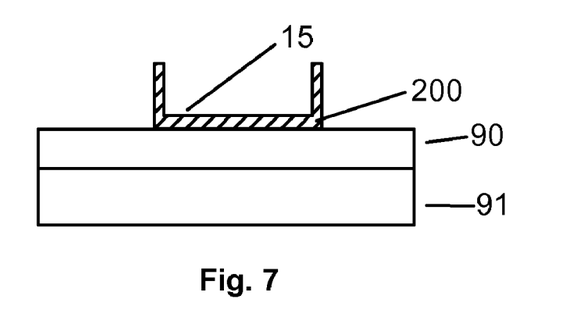
FIG. 7 shows in a schematic cross section the method of fabrication in a typical embodiment as a kernel has been completed.

FIG. 7 shows in a schematic cross section the method once the kernel 15 has been completed. The kernel 15 consists of the crystalline semiconductor material 200, and the kernel 15 comprises the FET body 10, which body has at least one vertically oriented section 11 and at least one horizontally oriented section 12.

Figure 6B:
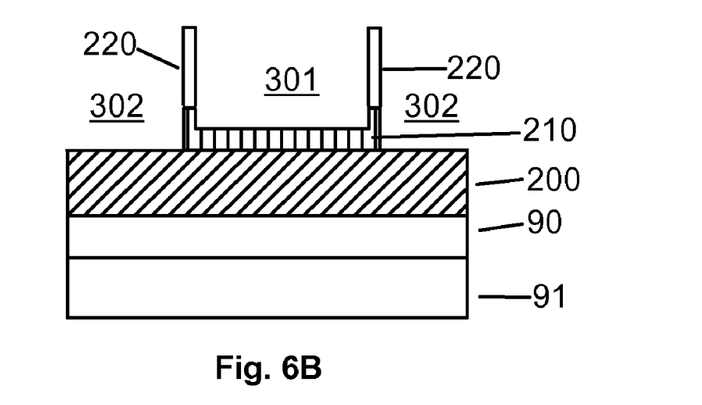
FIG. 6B shows the state of the method of fabrication in a typical embodiment after a first etch is completed.

Commencing at the state depicted in FIG. 6A, the formation 310—the $Si_3N_4$ wall 220, and thicker $SiO_2$ in the inside 301 an the thinner $SiO_2$ in the outside 302—has to be transferred into the first layer 200. The initial step to achieve this aim is performing a first etch to completely remove the second layer 210 from the outside 302, and to partially remove the second layer 210 from the inside 301. The first etch in an exemplary embodiment is a uniform plasma etch. Typically one uses a bromine based plasma, such HBr mixed with a small flow of oxygen. For a representative embodiment when the second layer 210 is a thermally deposited oxide (TEOS), typical parameters for the first etch are: a flow rate of about between 50-300 Standard Cubic Centimeter per Minute (SCCM) of HBr, and of about between 0-5 SCCM of $O_2$; a top rf source power of about between 200 W-350 W, bottom electrode (wafer) rf power: between about 150 W-350 W; pressure: between about 3-6 mTorr. Processing time is controlled by detecting complete removal of material on the outside, for instance optical emission spectroscopic (OES) end-point traces in the outside 302. The ion assistant reactive ion etching regime of the first etch ensures an etch rate of TEOS in the outside 302 which is similar, or slightly faster than the etch rate of TEOS in the inside 301. Accordingly, after fully removing TEOS in the outside 302, there is still a thin layer of TEOS left in the inside 301. For a typical embodiment, the state of the method of fabrication after the first etch is shown in FIG. 6B.

Figure 6C:
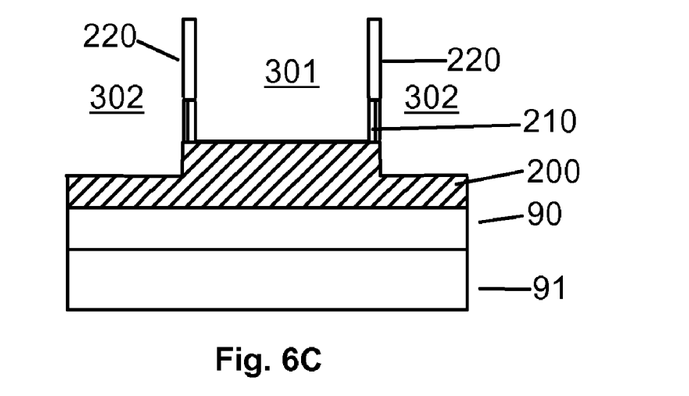
FIG. 6C shows the state of the method of fabrication in a typical embodiment after a second etch is completed.

Next, a using a second etch one fully removes the second layer 210, typically TEOS, in the inside 301, and partially removes the first layer 200, typically Si, in the outside 302. For a representative embodiment when the second layer 210 is TEOS, and the first layer 200 is Si, typical parameters for the plasma etch—the second etch—are: a flow rate of about between 150-300 SCCM of HBr; a top rf source power of about between 150 W-350 W, bottom electrode (wafer) rf power: between about 150 W-350 W; pressure: between about 3-6 mTorr. Etching time is of a few seconds, typically between about 7 sec and 15 sec. For a typical embodiment, the state of the method of fabrication after the second etch is shown in FIG. 6C.

Figure 6D:
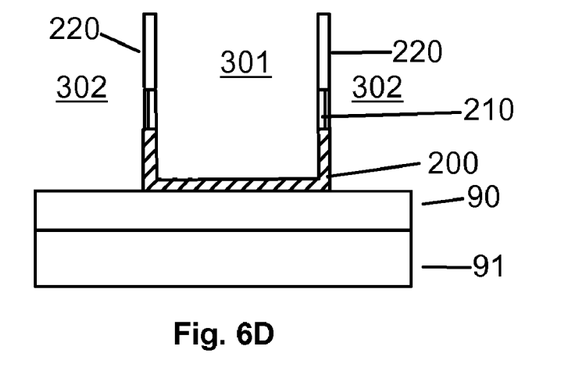
FIG. 6D shows the state of the method of fabrication in a typical embodiment after a third etch is completed.

Next, a using a third etch one fully removes the first layer 200, typically Si, in the outside 302. The duration of the third etch is again controlled by detecting complete removal of material on the outside, such as by OES end-point traces in the outside 302. When the Si 200 is fully removed in the outside 302, a layer of Si still remains in the inside, since after the second etch the Si 200 was thicker in the inside 301 than in the outside 302. For a representative embodiment when the first layer 200 is Si, typical parameters for the plasma etch— the third etch—are: a flow rate of about between 100-350 SCCM of HBr, and of about between 0-5 SCCM of $O_2$; a top rf source power of about between 80 W-250 W, bottom electrode (wafer) rf power: between about 10 W-100 W; pressure: between about 5-10 mTorr. For a typical embodiment, the state of the method of fabrication after the third etch is shown in FIG. 6D.

Having finished with these three etches one has transferred the formation 310 into the first layer 200. After removing the remaining silicon-nitride wall 220 and remaining TEOS mask layer 210 (which was under the wall), usually by wet etching, the result is the kernel 15. During the various etches the first layer 200 under the $Si_3N_4$ wall 220 was protected, with the result that it yields the vertically oriented sections for the body.

Optionally, before removing the silicon-nitride wall, one can execute a fourth etch to control the thickness of the first layer 200 in the inside 301, in order to control the first thickness 22 of the horizontally oriented sections for the body. For an exemplary embodiment when the first layer 200 is Si, typical parameters for the fourth etch are: a flow rate of about between 100-350 SCCM of HBr, of about between 0-5 SCCM of $O_2$, and of about between 100-350 SCCM of He; a top rf source power of about between 100 W-400 W, bottom electrode (wafer) rf power: between about 10 W-100 W; pressure: between about 20-100 mTorr.

If one desires, after the described etching steps took place, part of the kernel can be removed with standard etching techniques known in the art. This could be the case, for instance, if an odd number of vertically oriented sections, or an even number of horizontally oriented sections are needed. Or, one may be in need of various complicated layout shapes, which are best achieved by fabricating a kernel with several differently placed islands, and then etching away unwanted parts.

Having finished with the kernel 15, further processing for the sectional FET follows mainly along the lines of established FET processing. The exceptions are as follows. Given the shape of the gate electrode 50, which has to engage faces of various orientations extra care is needed during its deposition. Also, as discussed in relation to FIG. 2, a third layer 111 is deposited over the kernel 15 for the source/drain 110. The third layer 111 is typically Si and it is deposited over the Si of the kernel by selective epitaxy.

The fabricated segmented FET thus combines FinFET type devices with fully depleted planar devices. This combination allows device width control with FinFET type devices. The segmented FET device gives high current drive for a given layout area.

Figure 8:
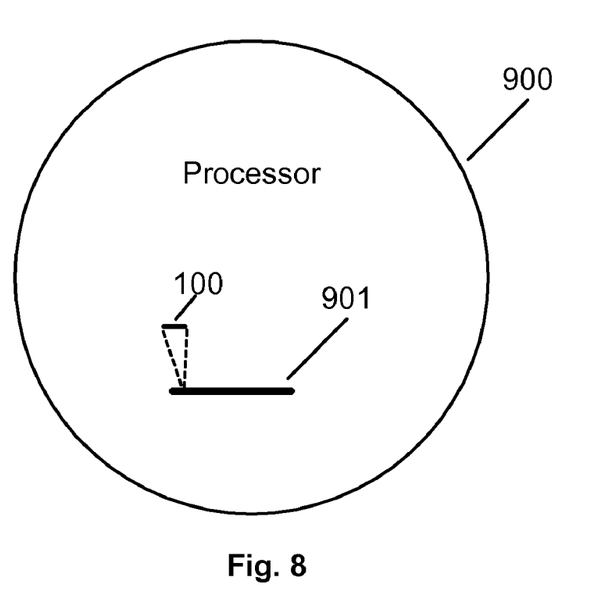
FIG. 8 shows a symbolic view of a processor containing at least one chip which contains at least one sectional FET.

FIG. 8 shows a symbolic view of a processor containing at least one chip which contains at least one sectional FET. Such a processor 900 has at least one chip 901, which contains at least one sectional FET 100 of the present invention. The processor 900 can be any processor which can benefit from the sectional FET device 100. These devices form part of the processor in their multitude on one or more chips 901. Representative embodiments of processors manufactured with sectional FET devices are digital processors, typically found in the central processing complex of computers; mixed digital/analog processors, which benefit significantly from the high performance of the sectional FET devices; and in general any communication processor, such as modules connecting memories to processors, routers, radar systems, high performance video-telephony, game modules, and others.

Many modifications and variations of the present invention are possible in light of the above teachings, and could be apparent for those skilled in the art. The scope of the invention is defined by the appended claims.

We claim:

1. A method for producing a field effect device, said method comprises:

providing a first layer of a crystalline semiconductor material, wherein said first layer is disposed on an insulator layer;

fabricating a formation, said formation comprises a second layer and a wall, wherein said second layer is disposed on said first layer and said wall is standing on said second layer, wherein said second layer and said wall are of differing materials, wherein during said fabrication of said wall said first layer and said insulator layer are of approximately equal dimension in a horizontal direction, and wherein said formation represents a pattern; and etching said second layer and said first layer until said pattern of said formation is transferred into said first layer, wherein leaving in place of said first layer only a kernel consisting of said crystalline semiconductor material, wherein said kernel comprises a body, wherein said body has at least one vertically oriented section and at least one horizontally oriented section, wherein said wall yields said at least one vertically oriented section and said second layer of said formation yields said at least one horizontally oriented section, and wherein said device comprises said body.

2. The method of claim 1, wherein said method further comprises engaging said body with a gate electrode, wherein said device comprises said gate electrode.

3. The method of claim 1, wherein said method further comprises depositing a third layer over a portion of said kernel, wherein said portion comprises a source and a drain, wherein said device comprises said source and said drain.

4. The method of claim 3, wherein said method further comprises selecting said third layer to consist of said crystalline semiconductor material, and selecting said depositing to be carried out by selective epitaxy.

5. The method of claim 1, wherein said method further comprises selecting said crystalline semiconductor material to be a Si based material.

6. The method of claim 5, wherein said method further comprises selecting said Si based material to be essentially Si.

7. The method of claim 1, wherein said method further comprises selecting said insulator layer to be a buried $SiO_2$ layer disposed on a Si wafer.

8. A method for producing a field effect device, said method comprises:

providing a first layer of a crystalline semiconductor material, wherein said first layer is disposed on an insulator layer;

fabricating a formation, said formation comprises a second layer and a wall, wherein said second layer is disposed on said first layer and said wall is standing on said second layer, wherein said second layer and said wall are of differing materials, wherein said formation represents a pattern;

etching said second layer and said first layer until said pattern of said formation is transferred into said first layer, wherein leaving in place of said first layer only a kernel consisting of said crystalline semiconductor material, wherein said kernel comprises a body, wherein said body has at least one vertically oriented section and at least one horizontally oriented section, wherein said wall yields said at least one vertically oriented section and said second layer of said formation yields said at least one horizontally oriented section, and wherein said device comprises said body;

wherein said method further comprises:

depositing and patterning a fourth layer on top of said second layer;

forming said wall around said pattern of said fourth layer;

defining an inside and outside of said wall;

etching to partially remove said second layer in said outside; and etching to leave only said second layer and said wall over said first layer, whereby having fabricated said formation.

9. The method of claim 8, wherein said method further comprises selecting said second layer to be a $SiO_2$ layer, and selecting said wall to be of $Si_3N_4$.

10. The method of claim 8, wherein said method farther comprises selecting said fourth layer to be an amorphous Si layer.

11. The method of claim 9, wherein said method further comprises disposing a fifth layer in said inside for protecting said $SiO_2$ layer.

12. A method for producing a field effect device, said method comprises:

providing a first layer of a crystalline semiconductor material, wherein said first layer is disposed on an insulator layer;

fabricating a formation, said formation comprises a second layer and a wall, wherein said second layer is disposed on said first layer and said wall is standing on said second layer, wherein said second layer and said wall are of differing materials, wherein said formation represents a pattern;

etching said second layer and said first layer until said pattern of said formation is transferred into said first layer, wherein leaving in place of said first layer only a kernel consisting of said crystalline semiconductor material, wherein said kernel comprises a body, wherein said body has at least one vertically oriented section and at least one horizontally oriented section, wherein said wall yields said at least one vertically oriented section and said second layer of said formation yields said at least one horizontally oriented section, and wherein said device comprises said body;

wherein said method further comprises:

defining an inside and outside of said wall;

using a first etch to remove said second layer in said outside;

using a second etch to remove said second layer in said inside, and to partially remove said first layer in said outside; and using a third etch to remove said first layer in said outside, whereby having transferred said formation into said first layer.

13. The method of claim 12, wherein said method further comprises using a fourth etch to decrease thickness of said first layer in said inside.

14. The method of claim 12, wherein said method further comprises selecting said second layer to be a $SiO_2$ layer, selecting said wall to be made of $Si_3N_4$, and selecting said crystalline semiconductor material to be essentially Si.

* * * * *